United States Patent [19]

Nakasone et al.

[11] 4,430,595
[45] Feb. 7, 1984

[54] PIEZO-ELECTRIC PUSH BUTTON SWITCH

[75] Inventors: Hiroyuki Nakasone, Tokyo; Takayasu Sakamoto, Kawagoe, both of Japan

[73] Assignee: Toko Kabushiki Kaisha, Tokyo, Japan

[21] Appl. No.: 405,156

[22] Filed: Aug. 4, 1982

[30] Foreign Application Priority Data

Aug. 7, 1981 [JP] Japan .......................... 56-117874[U]
Aug. 7, 1981 [JP] Japan .......................... 56-117875[U]

[51] Int. Cl.³ .......................................... H01L 41/08
[52] U.S. Cl. .................................................. 310/339
[58] Field of Search ........................ 310/339; 361/260; 340/365 A

[56] References Cited

U.S. PATENT DOCUMENTS

| | | | |
|---|---|---|---|
| 3,364,451 | 1/1968 | Paul et al. | 310/339 X |
| 3,457,461 | 7/1969 | Steinke et al. | 310/339 X |
| 3,464,531 | 9/1969 | Herr et al. | 310/339 X |
| 3,984,738 | 10/1976 | Mohr | 310/339 X |

FOREIGN PATENT DOCUMENTS 2210359  9/1973  Fed. Rep. of Germany ...... 310/339

Primary Examiner—Mark O. Budd
Attorney, Agent, or Firm—Wenderoth, Lind & Ponack

[57] ABSTRACT

In a piezo-electric push button switch, a flexible printed circuit board is secured to terminals which are embedded in the housing, and the piezo-electric plate is supported by the flexible printed circuit board in such a manner that it is floated from the housing, whereby external impact or vibration is decreased, and in which an integrated circuit consisting of a resistor and a capacitor is incorporated in the switch body, to eliminate harmonics.

4 Claims, 4 Drawing Figures

PIEZO-ELECTRIC PUSH BUTTON SWITCH

BACKGROUND OF THE INVENTION

This invention relates to a piezo-electric push button switch in which an electromotive force generated by distorting the piezo-electric plate is employed as a switching signal.

In a conventional push button switch of this type, the click operation of a plunger is obtained by utilizing a force of attraction between the plunger and a permanent magnet which is mounted on a housing. However, the push button switch is disadvantageous in that owing to the above-described arrangement, it is difficult to miniaturize the switch and the switch itself has a high manufacturing cost.

Furthermore, the conventional push button switch of this type suffers from a drawback that, because the piezo-electric plate or leads fixedly secured to the piezo-electric plate are secured directly to the housing, external impact on or vibration of the housing or the terminals is transmitted to the piezo-electric plate so as to generate an electromotive force, so that the switch may be erroneously operated.

When the output of the piezo-electric switch is taken out as it is and is amplified, the output thus amplified includes a number of harmonics, thus showing a number of peaks. Accordingly, the apparent characteristic of the switch is such that the switch undergoes chattering or bouncing. Therefore, heretofore, a load resistor has been connected through an integration circuit consisting of a series resistor and a parallel capacitor, which is provided outside of the switch, so that the output of the piezo-electric plate is supplied to the amplifier after being converted into a signal having a single peak.

SUMMARY OF THE INVENTION

Accordingly, an object of this invention is to eliminate the above-described drawbacks of a conventional piezo-electric push button switch.

More specifically, an object of the invention is to provide a piezo-electric push button switch in which the effect of external impact or vibration is decreased and an integration circuit can be incorporated in the switch body.

The foregoing object and other objects of the invention have been achieved by the provision of a piezo-electric push button switch which, according to the invention, comprises: a housing in which a plurality of terminals are embedded; a depressing member which is movably mounted in the housing; a piezo-electric plate which has electrodes on both surfaces thereof, and is polarized in the direction of the thickness thereof, the piezo-electric plate being supported on an elastic member which in turn is mounted on the housing; an electrically conductive plate which is secured to the upper surface electrode of the piezo-electric plate; and striking means interposed between the depressing member and the electrically conductive plate.

The nature, principle and utility of the invention will become more apparent from the following detailed description when read in conjunction with the accompanying drawings.

DETAILED DESCRIPTION OF THE INVENTION

Figure 1:
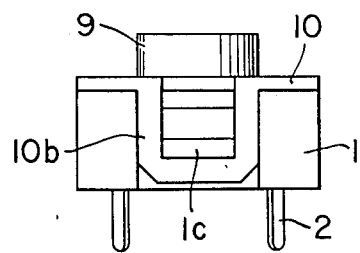
FIG. 1 is a front view of one example of a piezo-electric push button switch according to this invention.
Figure 4:
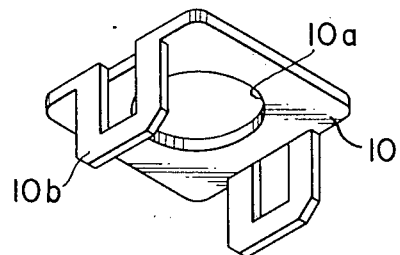
FIG. 4 is an exploded view of the switch according to the invention.
Figure 2:
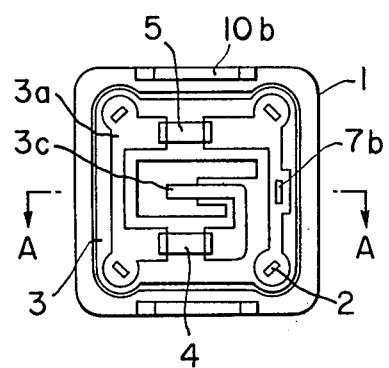
FIG. 2 is a bottom view of the switch in FIG. 1.
Figure 2:
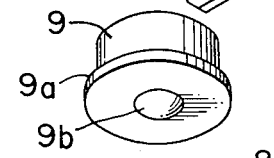
Figure 2:
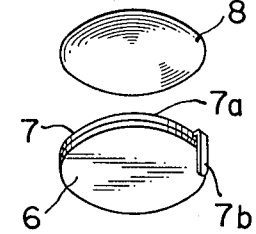
Figure 3:
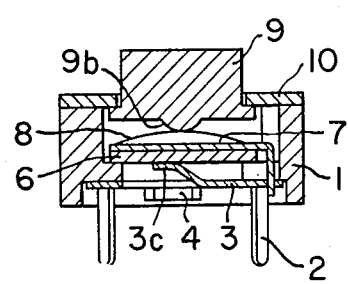
FIG. 3 is a sectional view taken along line A—A in FIG. 2.
Figure 3:
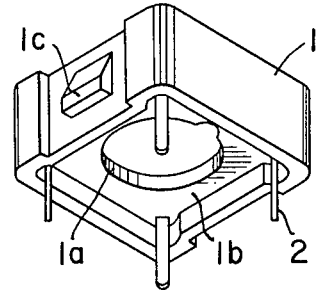
Figure 3:
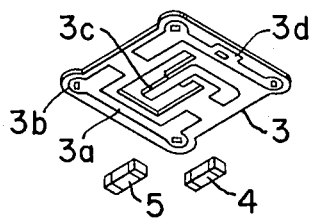

One example of a piezo-electric push button switch according to the invention, as shown in FIGS. 1 through 4, has a housing 1. The housing 1 has openings in the upper and lower surfaces and terminals 2 embedded in four corners. The housing 1 further has a transverse partition 1b with a through-hole 1a at the center. Hook-shaped protrusions 1c are provided on the outside of two opposite side walls of the housing 1, respectively. A flexible printed circuit board 3 made of this film of polyimide or polyethylene, etc. is substantially square and has printed wiring 3a on the lower surface. The circuit board 3 has four through-holes 3b, into which the terminals 2 are inserted and are then soldered to the printed wiring 3a, so that the circuit board 3 is fixedly secured to the terminals 2. A protruding piece 3c is formed in the central part of the printed circuit board 3 by punching. The protruding piece has the free end covered by the printed wiring 3a. A chip-like resistor 4 and chip-like capacitor 5 are soldered to the lower surface of the printed circuit board 3.

A disk-shaped piezo-electric plate 6 is placed on the partition 1b. The piezo-electric plate 6 is polarized in the direction of thickness and has electrodes (not shown) which are formed by printing silver on both surfaces. The upper surface of the piezo-electric plate 6 is bonded to a conductive plate 7. The plate 7 comprises a disk-shaped part 7a to which the piezo-electric plate 6 is fixedly secured, and a lead part 7b which extends from the disk-shaped part 7a. The lead part 7b is soldered after being inserted into a through-hole 3d in the printed circuit board 3, so that the conductive plate 7 together with the piezo-electric plate is secured to the printed circuit board 3. The protruding piece 3c of the printed circuit board is bent upwardly and is then soldered to the lower electrode of the piezo-electric plate 6. A dome-shaped metal spring 8 is placed on the conductive plate 7, and a plunger 9 is placed on the metal spring 8. A spacer may be provided between the conductive plate 7 and the spring 8. The plunger 9 has a flange 9a and a semispherical protrusion 9b at the lower end. A cover 10 has a through-hole 10a into which the plunger 9 is inserted, and two locking pieces 10b on two opposite sides. The cover 10 is secured to the housing 1 by engaging the locking pieces 10b with the protrusions 1c of the housing.

When the plunger 9 of the piezo-electric push button switch thus constructed is depressed, the spring 8 depressed by the protrusion 9b is abruptly bent to strike the conductive plate 7 thereby to distort the piezo-electric plate 6. Therefore, an electromotive force is developed across the terminals 2 through the lead part 7b and the protruding piece 3c. The output provided across the terminals 2 is a single waveform-shaped by an integration circuit consisting of the resistor 4 and the capacitor 5.

When the plunger 9 is released, the plunger 9 is returned to the original position by the restoring force of the spring 8.

When the spring is bent, the operator can feel a clicking motion through the plunger 9 and the finger. Therefore, the operator can confirm that the switch has been operated.

Heretofore, the piezo-electric plate has been fixedly secured to the partition 1b of the housing, or the lead part of the conductive plate to which the piezo-electric plate has been bonded is fixedly inserted into the housing, or the prolongations of the terminals 2 are soldered to the lower electrode of the piezo-electric plate.

On the other hand, according to the invention, the piezo-electric plate is merely placed on the partition but it is not fixedly secured to the housing, and the lead part of the conductive plate to which the piezo-electric plate has been secured is fixedly connected to the flexible printed circuit board instead of the housing, and the flexible protruding piece of the printed circuit board is in contact with the lower electrode of the piezo-electric plate. Therefore, the piezo-electric plate floats free of the housing by being supported by the protruding piece on the flexible printed circuit board. Therefore, external impact or vibration is absorbed by the flexibility of the protruding piece on the printed circuit board, and accordingly the piezo-electric push-button switch according to the invention has an excellent S/N ratio and a positive operation.

Furthermore, according to the invention, it is unnecessary to externally connect the resistor and the capacitor. Therefore, the switch has excellent in operability.

What is claimed is:

1. A piezo-electric push button switch comprising:
    a housing having a plurality of terminals embedded therein;
    a depressing member which is movably mounted in said housing;
    a flexible printed circuit board in said housing which electrically is conductively secured to said terminals for being mounted thereon;
    an electrically conductive plate in said housing between said circuit board and said depressing member and having a plate part and a lead part, said lead part being electrically conductively secured to said flexible printed circuit board;
    a piezo-electric plate which has electrodes on both surfaces thereof and is polarized in the direction of the thickness thereof, said piezo-electric plate being fixedly secured to the surface of said electrically conductive plate which is toward said circuit board;
    a further lead part between said flexible printed circuit board and said electrode on said piezo-electric plate which is toward said flexible circuit board and mechanically and electrically conductively connecting said electrode and said circuit board; and
    striking means constituted by a dome-shaped metal spring and interposed between said depressing member and said electrically conductive plate and which is deformed by depression of said depressing member to thereby strike a blow on said electrically conductive plate.

2. A piezo-electric push button switch as claimed in claim 1 in which said further lead part is a protruding piece on said circuit board and secured to said electrode of said piezo-electric plate which is toward said circuit board.

3. A piezo-electric push button switch as claimed in claim 2, further comprising a chip-shaped resistor and/or a chip-shaped capacitor is connected to said printed circuit board.

4. A piezo-electric push button switch as claimed in claim 3, in which said resistor and said capacitor connected to said printed circuit board form an integrated circuit.

* * * * *